(12) United States Patent
Hall et al.

(10) Patent No.: US 6,459,325 B1
(45) Date of Patent: Oct. 1, 2002

(54) OUTPUT BUFFER HAVING A PRE-DRIVER TRANSITION CONTROLLER

(75) Inventors: Geoffrey B. Hall; Fujio Takeda; Michael Priel, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/832,149

(22) Filed: Apr. 11, 2001

(51) Int. Cl.[7] .............................................. H03K 17/16
(52) U.S. Cl. ...................... 327/391; 327/387; 327/374; 327/108; 326/27; 326/83
(58) Field of Search ................................ 327/108, 112, 327/170, 374, 387, 389, 391; 326/27, 83

(56) References Cited

U.S. PATENT DOCUMENTS

| | | | |
|---|---|---|---|
| 5,111,076 A | * 5/1992 | Tarng | 326/27 |
| 5,214,320 A | * 5/1993 | Truong | 326/27 |
| 5,233,238 A | * 8/1993 | Mattos | 326/27 |
| 5,537,070 A | 7/1996 | Risinger | 327/170 |
| 6,172,525 B1 | * 1/2001 | Wennekamp | 326/83 |
| 6,184,703 B1 | * 2/2001 | Vest et al. | 326/27 |
| 6,236,248 B1 | * 5/2001 | Koga | 327/112 |

* cited by examiner

*Primary Examiner*—Timothy P. Callahan
*Assistant Examiner*—Terry L. Englund
(74) *Attorney, Agent, or Firm*—Daniel D. Hill

(57) ABSTRACT

An output buffer (100) has a pre-driver circuit (120) for controlling a voltage transition of an output signal from an output driver transistor (150). The pre-driver circuit (120) provides an input that slightly leads the gate voltage of the output driver transistor (150). The pre-driver circuit (120) includes a configurable resistance circuit (480) that provides one resistance value at the start of a signal transition and provides another resistance value near the end of the signal transition. A threshold detector (470) senses a voltage level of the input signal and switches from one resistance value to the other resistance value when the input signal crosses a predetermined voltage.

15 Claims, 3 Drawing Sheets

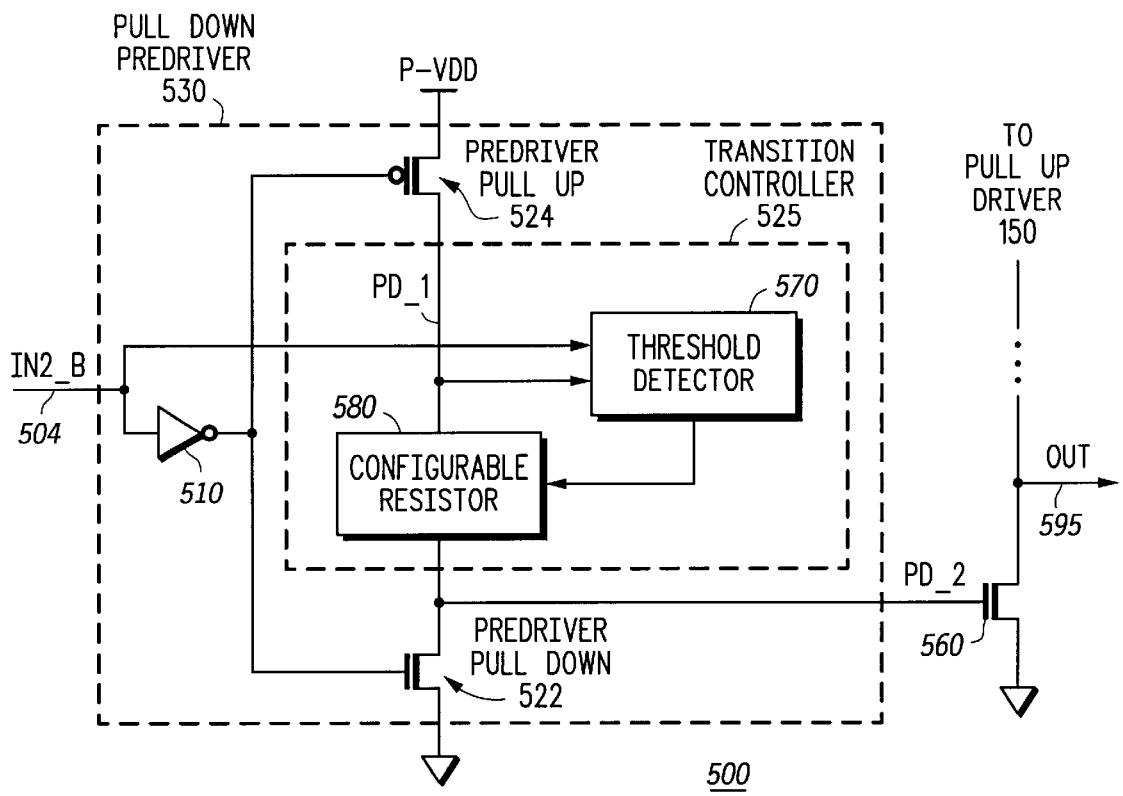
FIG.5
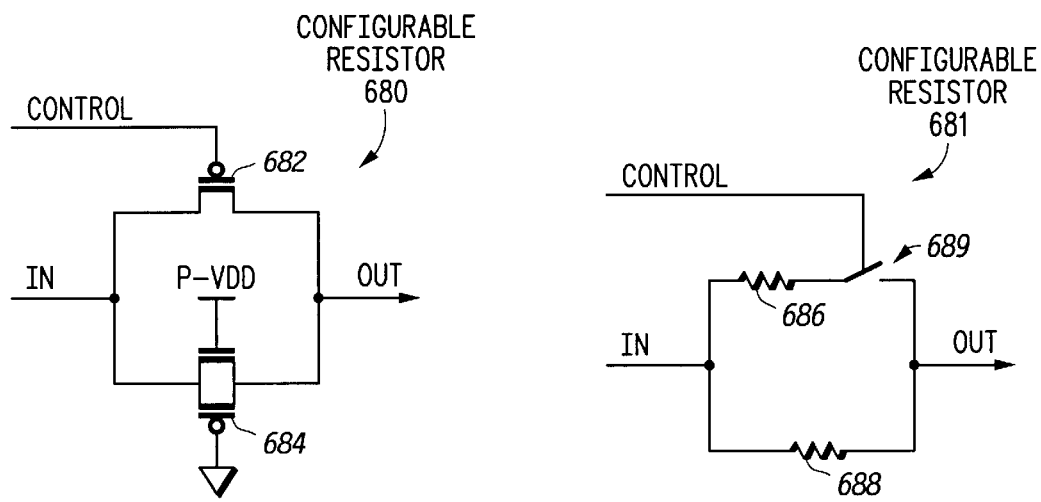
FIG.6A  FIG.6B

OUTPUT BUFFER HAVING A PRE-DRIVER TRANSITION CONTROLLER

BACKGROUND

1. Technical Field

The present invention relates generally to output buffer pre-drivers, and, more particularly, it relates to pre-driver transition control circuitry that controls the transition rate of the controlling terminal of an output driver.

2. Related Art

Conventional pre-driver circuitry presents significant problems in the context of power/ground noise. To switch an output signal with respect to its voltage level, a turning on of output drive current is required, representing a change in current. As this current must flow through the combined inductance of an integrated circuit (IC) package and the power or ground trace on a circuit board on which the IC is placed, the rate of change of current (dI/dt) produces a voltage signal on the power or ground trace on the circuit board. Undesirable Electro-Magnetic Interference (EMI) noise is emitted from power/ground traces, resulting from this power/ground voltage noise. Commonly, many output drivers are sourced by a given power/ground trace. The total noise effects are cumulative, in that, the total time current derivative (dI/dt) is often the sum total of the dI/dt of each of the several high current buffers which may transition simultaneously in the given application.

For some applications, such as wireless communications, the resulting EMI noise can even result in a loss of reception. For example, in the wireless communication context, a call can be lost solely due to EMI associated with a power/ground trace within the entire wireless circuitry. In addition, the propagation delay through all of the preceding circuitry and the final output driver inherently become a design consideration in attempting to deal with the undesirable dI/dt problem. The propagation delay is one design constraint that inherently competes with conventional methods that seek to minimize the effect of a high dI/dt through the final output driver.

Present solutions fail to provide a circuit that delivers charge to the gate of the output driver transistor in such a manner so as to cross the driver transistor's turn-on threshold in the desired controlled manner, while at the same time avoiding the penalty of increased propagation delay. Currently there is not a circuit that provides for a very quick approach to the turn-on threshold within metal oxide semiconductor field effect transistor (MOSFET) technology that is commonly employed in many applications requiring low noise.

The rate of change in output drive current (dI/dt) is determined by the drive strength of the pre-driver transistor that is turned on during the turn-on phase of the associated output driver transistor. To adequately limit the maximum dI/dt, which occurs under best case conditions, a sufficiently slowed down pre-driver, using conventional methods, may produce a significant delay as compared to a pre-driver not so constrained. Such a delay is a substantial reduction in performance for many high speed applications.

Several conventional solutions have been presented to address pre-driver transition problems and try to provide a pad pre-driver speed improvement. One conventional solution is for a given output driver, the dI/dt is controlled by designing the pre-driver such that its output voltage crosses the threshold of the output transistor gradually. Here, the pre-driver is typically sized such that it charges the gate of the output driver at a predetermined and desired rate. However, as mentioned above, the propagation delay of the entire circuitry is significantly compromised. Another conventional solution connects a current source into a diode-connected device in series with a capacitor to generate a controlled charge rate for the gate of the output driver, offset by a threshold voltage. However, this conventional method suffers, in that, the required capacitor to perform this function is typically large when compared to the output driver gate capacitance. In addition, a diode-connected device is typically not strong enough to provide an offset lower than the threshold of the output transistor. The undesirable result is that the output transistor turns on abruptly. Any conventional solution that seeks to employ a slew rate control circuitry responding to the time voltage derivative (dV/dt) of the output pad cannot sufficiently address the associated dI/dt problems because dV/dt inherently lags dI/dt in such applications.

Further limitations and disadvantages of conventional and traditional systems will become apparent to one of ordinary skill in the art through comparison of such systems with the present invention as set forth in the remainder of the present application with reference to the drawings.

BRIEF DESCRIPTION OF THE DRAWINGS

A better understanding of the present invention can be obtained when the following detailed description of various exemplary embodiments are considered in conjunction with the following drawings.

FIG. 5 illustrates, in schematic diagram form, another embodiment of a pull down pre-driver built in accordance with the present invention.

FIG. 6A illustrates, in schematic diagram form, one embodiment of a configurable resistor built in accordance with the present invention.

FIG. 6B illustrates, in schematic diagram form another embodiment of a configurable resistor built in accordance with the present invention.

DETAILED DESCRIPTION

Figure 1:
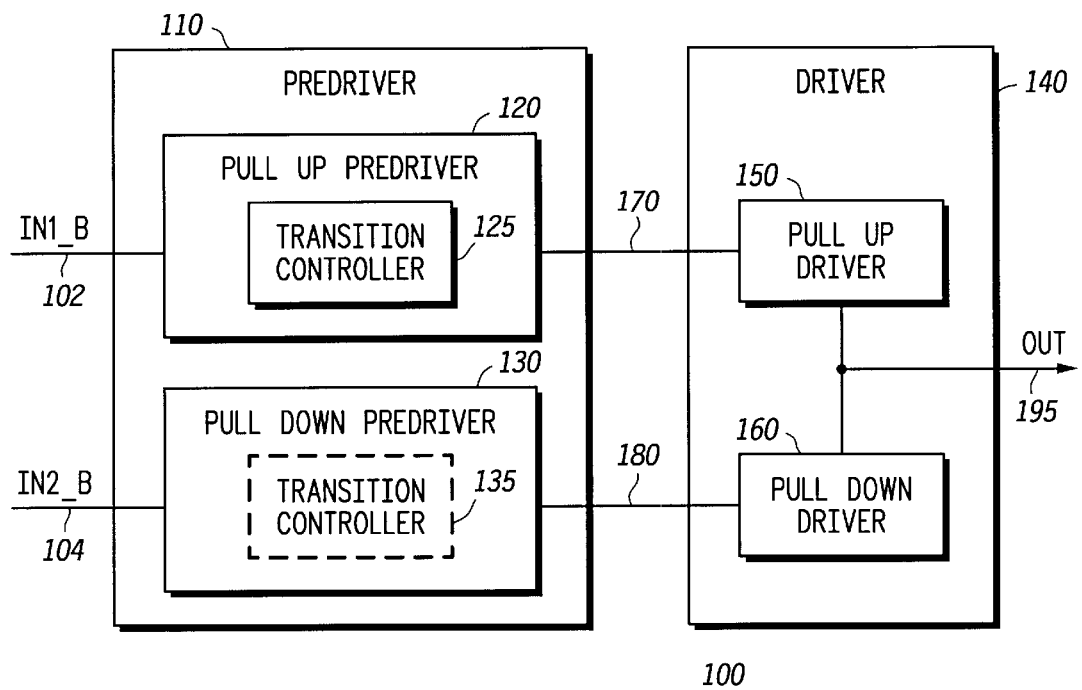
FIG. 1 illustrates, in block diagram form, one embodiment of an output driver in accordance with the present invention.

Within all of the following detailed description of the invention, it is noted that the transistors described herein (whether bipolar, field effect, PMOS, NMOS, CMOS, etc.) may be conceptualized as having a control terminal that controls the flow of current between a first current handling terminal and a second current handling terminal. An appropriate condition on the control terminal causes a current to flow from/to the first current handling terminal and to/from the second current handling terminal.

For example, in a bipolar NPN transistor, the first current handling terminal is the collector, the control terminal is the base, and the second current handling terminal is the emitter. A sufficient current into the base causes a collector-toemitter current to flow. In a bipolar PNP transistor, the first current handling terminal is the emitter, the control terminal is the base, and the second current handling terminal is the collector. A current flowing between the base and emitter causes an emitter-to-collector current to flow.

Also, although field effect transistors (FETs) are frequently discussed as having a drain, a gate, and a source, in most such devices the drain is interchangeable with the source. This is because the layout and semiconductor processing of the transistor is frequently symmetrical. For an n-channel FET, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in n-channel FET device equations merely refers to which drain or source terminal has the lower voltage at any given point in time.

For example, the "source" of the n-channel device of a bi-directional CMOS transfer gate depends on which side of the transfer gate is at the lower voltage. To reflect this symmetry of most n-channel FET devices, the control terminal may be deemed the gate, the first current handling terminal may be termed the "drain/source", and the second current handling terminal may be termed the "source/drain". Such a description is equally valid for a p-channel FET device, since the polarity between drain and source voltages, and the direction of current flow between drain and source, is not implied by such terminology. Alternatively, one current-handling terminal may arbitrarily be deemed the "drain" and the other deemed the "source", with an implicit understanding that the two are not distinct, but interchangeable.

The following is intended to provide a detailed description of at least one example of the invention and should not be taken to be limiting of the invention. Rather, any number of variations may fall within the scope of the invention which is properly defined in the claims.

In response to a request to transition a signal on an output terminal, a pre-driver is activated to switch the controlling terminal of an output driver at the faster of two selectable transition rates. The controlling terminal of a threshold detector receives a signal that leads, in the time domain, the signal on the controlling terminal of the output driver. Before the turn on threshold of the output driver is reached, the threshold detector responds to the transition on its controlling input by reconfiguring the pre-driver to drive the controlling terminal of the output driver at the slower transition rate.

Generally, the present invention provides, an output buffer having a transition controller for use in an integrated circuit, such as, for example, a microprocessor, a wireless communications device, a computer system, etc. The output buffer includes a driver circuit for driving an output signal on an output terminal. The output signal corresponds to an input signal received at an input of the driver circuit. The driver circuit includes an output driver pull up transistor and a pull up pre-driver. The pull up pre-driver includes a pre-driver pull up, a pre-driver pull down and a pre-driver transition controller. The transition controller includes a configurable resistor and a threshold detector. The configurable resistor has an input terminal coupled to the pre-driver pull down, an output terminal coupled to the driver and the pre-driver pull up, and a control terminal coupled to the threshold detector. The threshold detector is coupled to the pre-driver pull down and the controlling terminal of the configurable resistor. The transition controller selects a configuration for the configurable resistor based on the signal received from the pre-driver pull down.

FIG. 1 illustrates, in block diagram form, an output driver 100 in accordance with the present invention. Output driver 100 includes a pre-driver 110, a driver 140, and an OUT terminal 195. Driver 140 is a relatively high current buffer from which an OUT signal 195 is provided. The pre-driver 110 contains a pull up pre-driver 120 having a transition controller 125 and a pull down pre-driver 130 that has an optional transition controller 135. The transition controller 135 is illustrated in the embodiment of the invention shown in the FIG. 1, but the transition controller 135 is omitted in other embodiments of the invention. One skilled in the art would recognize that a corresponding pull down pre-driver 130 could be realized according to the same principles pertaining to pre-deriver 120. A particular application may employ pre-driver 120, pre-driver 130, or both. For those embodiments in which the pull down pre-driver is already sufficiently capable of performing a pull down transition, the transition controller 135 is omitted as being unnecessary. However, for other applications that may require control of the pull down transition, the transition controller 135 is included as indicated by the dashed box in FIG. 1.

When buffer 100 is configured for output to terminal 195, the pre-drivers 120 and 130 will be configured to receive a common signal or similar signals (IN1_B, IN2_B) from circuits (not shown) that are implemented on the same integrated circuit as output driver 100. An intermediate signal on a conductor 170 is received by pull-up driver 150 from pull up pre-driver 120, which in turn drives a high transitioning signal on terminal 195. An intermediate signal on a conductor 180 is received by pull-down driver 160 from pull down pre-driver 130, which in turn drives a low transitioning signal on terminal 195.

Pre-drivers 120 and 130 are used to condition the common signal, or similar signal, for use by drivers 150 and 160 respectively. Included in pre-driver conditioning is timing control, to assure the pull-up and pull-down drivers 150 and 160 are not simultaneously activated, and conditioning of the voltage and current levels of the signals 170 and 180 to assure proper interface with the components internal to the drivers 150 and 160.

The pull up pre-driver 120 conditions the controlling input 170 to pull up driver 150 so as to control the rate of increase of drive current (dI/dt) associated with the onset of a pull up transition of terminal 195. The pull up pre-driver 120 includes a pre-driver transition controller. The transition controller provides a fast mode and a slow mode of transition of the controlling terminal 170 of the pull up driver 150.

The OUT signal is an output signal having relatively high drive strength. The OUT signal is provided to any number of electrical connections for transmitting signal OUT from the integrated circuit to another circuit or device that is external to the integrated circuit, including, but not limited to, a pad, a circuit board trace, and a wirebond.

The transition controller 125 provides for a very quick transition to threshold within the output driver 100 in such a way as to minimize not only any rapid crossing of the voltage that is required to reach the turn-on threshold of the pull up driver 150, but also minimizes propagation delay in an efficient and robust manner.

Figure 2:
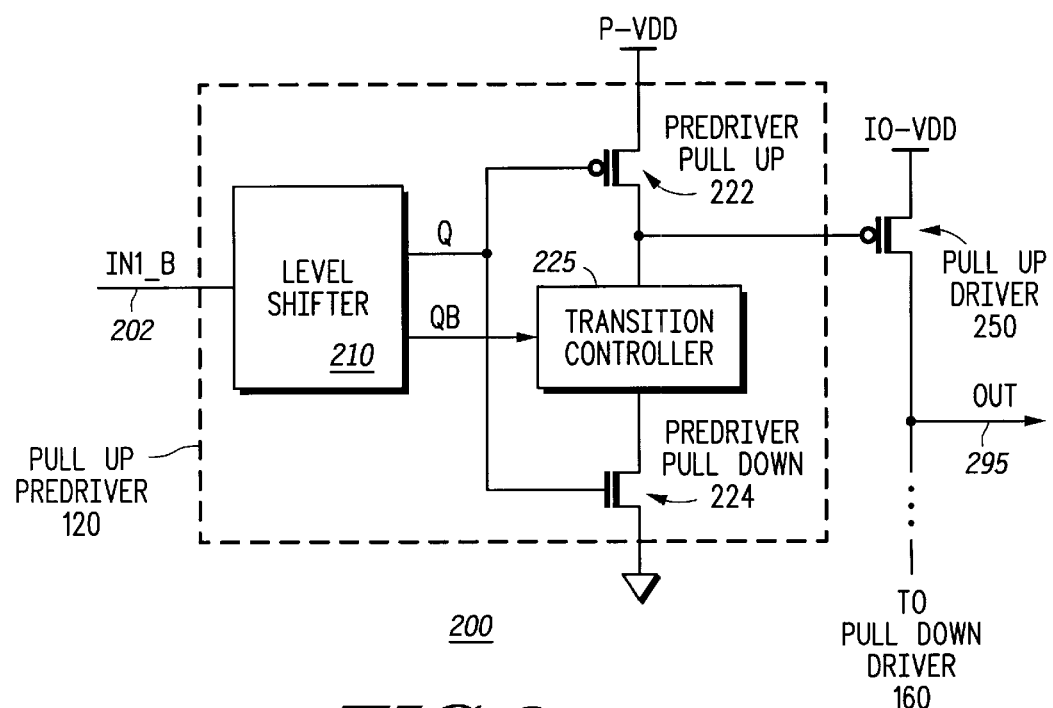
FIG. 2 illustrates, in partial block and partial schematic diagram form, the pull up pre-driver of the output driver of FIG. 1 in more detail.

FIG. 2 illustrates, in partial block and partial schematic diagram form, the pull up pre-driver 120 of FIG. 1 as part of an output driver circuit portion 200. The pull up pre-driver 120 includes a pre-driver pull up P-channel transistor 222, a pre-driver pull down N-channel transistor 224, and a transition controller 225. An IN1_B signal 202 is provided to a level shifter 210. In the illustrated embodiment, the IN1_B signal 202 is an active-low data signal at a core, or internal, voltage level. Core voltage levels are in the range of 2–3 Volts in certain embodiments of the invention. From the level shifter 210, complementary signals are provided, a signal labeled "Q" and a signal labeled "QB". The "Q" signal and the "QB" signal are complementary active-high and active-low data signals. The "QB" signal is provided to the transition controller 225 within the pull up pre-driver 120. In addition, the "Q" signal is provided to both the pre-driver pull up 222 and the pre-driver pull down 224. In the embodiment shown in the FIG. 2, the pre-driver pull up 222 is illustrated as a PMOS transistor device, and the pre-driver pull down 224 is illustrated as an NMOS transistor device.

Level shifter 210 may be implemented in the form of a differential is amplifier having cross-coupled P-channel pull-up transistors each coupled to N-channel current sources gated by input signal IN1_B.

The transition controller 225 is operable to ensure that the controlling voltage signal that is received by a pull up driver P-channel transistor 250 does not suffer from the deleterious effects of rapid crossing of the voltage that is required to reach the turn-on threshold of the pull up driver 250, and it also minimizes the total propagation delay throughout the pull up pre-driver 120 and its associated circuitry 200. Generally, transition controller 225 includes a variable, or configurable, resistance having two values. The configurable resistance is used to control how quickly driver transistor 250 pulls up the voltage at output terminal 295. A first value allows the voltage at the gate of transistor 250 to transition relatively quickly at the beginning of a transition from a high voltage to a low voltage. As the voltage of signal QB approaches a predetermined voltage, a second resistance value, higher than the first resistance value, slows the transition of the gate voltage thereby slowing the turn-on of transistor 250. Ultimately, an OUT signal is driven by the pull up driver transistor 250, and the OUT signal at terminal 295 may also be coupled to a pull down driver 160 as illustrated in FIG. 1.

Figure 3:
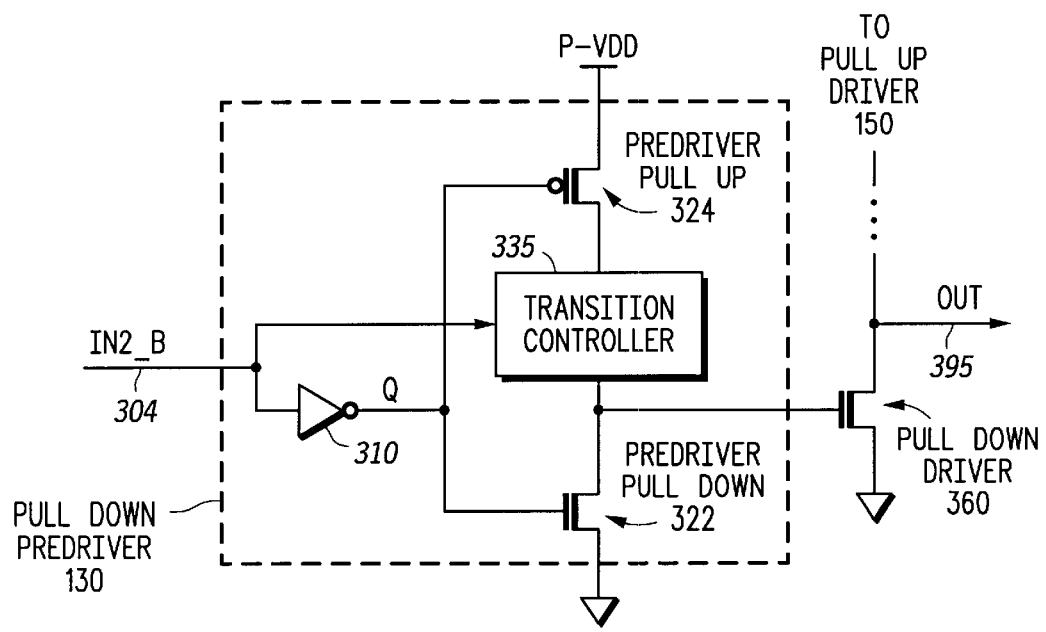
FIG. 3 illustrates, in partial block and partial schematic diagram form, another embodiment of a pull down pre-driver in accordance with the present invention.

FIG. 3 illustrates, in partial block and partial schematic diagram form, a pull down pre-driver 130 of FIG. 1 in a circuit portion 300. In many respects, the pull down pre-driver 130 functions similarly to the pull up pre-driver 120 of FIG. 2. For example, the pull down pre-driver 130 includes a pre-driver pull up P-channel transistor 324, a pre-driver pull down N-channel transistor 322, and a transition controller 335. An IN2_B signal 304 is provided to both an inverter 310 and the transition controller 335. In the illustrated embodiment, signal IN2_B is an active-low data signal operational over a core voltage range. Core voltage levels are in the range of is 2–3 Volts in certain embodiments of the invention. One portion of the IN2_B signal 304, after being inverted using the inverter 310, is provided to the gates of pre-driver pull up transistor 324 and the pre-driver pull down transistor 322.

As described above in the discussion of FIG. 2, transition controller 335 includes a variable, or configurable, resistance having two values. The configurable resistance is used to control how quickly driver transistor 360 pulls down the voltage at output terminal 395. A first value allows the voltage at the gate of transistor 360 to transition relatively quickly at the beginning of a transition from a low voltage to a high voltage. As the voltage approaches a predetermined voltage level, a second resistance value, higher than the first resistance value, slows that transition of the gate voltage thereby slowing the turn-on of transistor 360.

Transition controller 335 ensures that the controlling voltage signal that is received at the gate of pull down driver transistor 360 does not suffer from the deleterious effects of rapid crossing of the voltage that is required to reach the turn-on threshold of the pull down driver 360, and it also minimizes the total propagation delay throughout the pull down pre-driver 130 and its associated circuitry 300. Ultimately, an OUT signal 395 is driven by the pull down driver 360 and the OUT signal 395 is also coupled to the pull up driver 150 illustrated in the FIG. 1.

Figure 4:
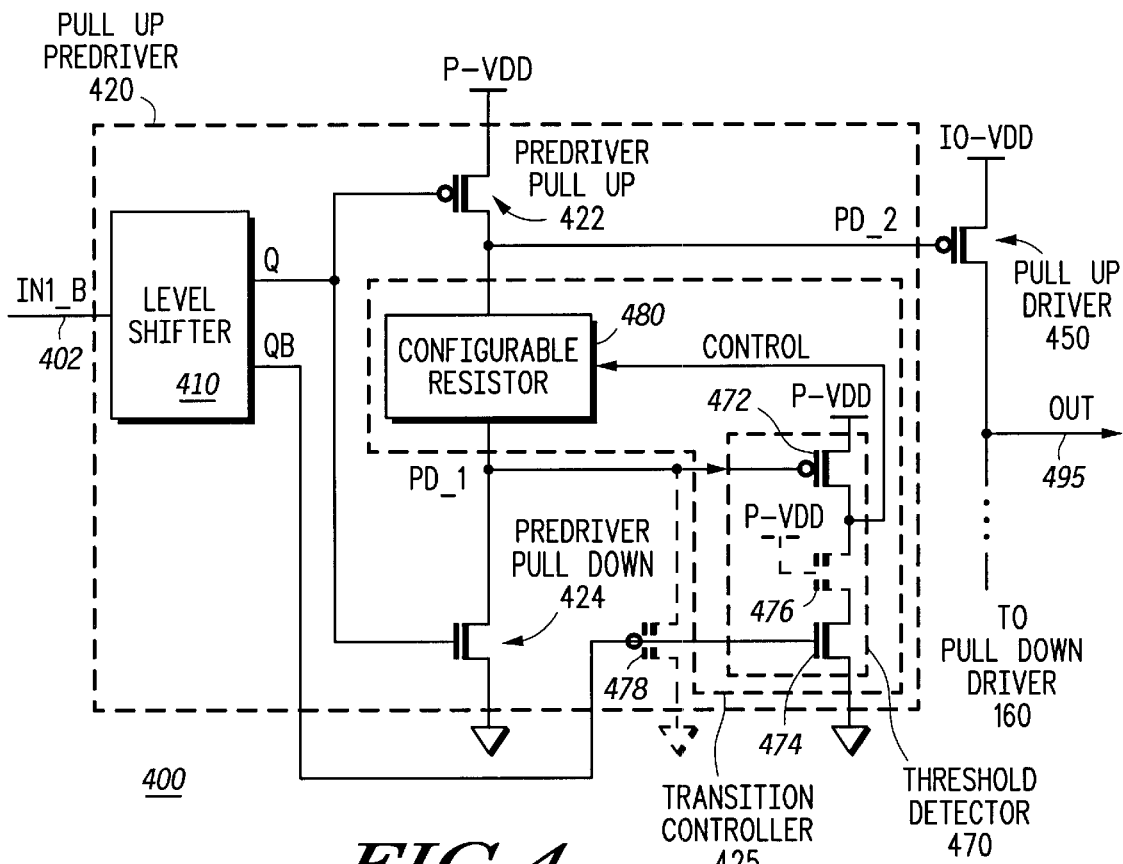
FIG. 4 illustrates, in schematic diagram form, another embodiment of a pull up pre-driver in accordance with the present invention.

FIG. 4 illustrates, in schematic diagram form, a circuit portion 400 including a pull up pre-driver 420 in accordance with another embodiment of the present invention. The pull up pre-driver 420 is, in many ways, analogous to the pull up pre-driver 120 of the FIG. 2. The pull up pre-driver 420 includes a pre-driver pull up transistor 422, a pre-driver pull down transistor 424, a transition controller 425, a threshold detector 470, and optionally, a P-channel transistor 478 and an N-channel transistor 476. An IN_B signal 402 is provided to a level shifter 410. Level shifter 410 provides complementary signals labeled "Q" and ."QB". Signal Q is provided to the gates of transistors 422 and 424. Signal QB is provided to the transition controller 425 within the pull up pre-driver 420.

The transition controller 425 within the pull up pre-driver 420 includes, the threshold detector 470 and a configurable resistor 480. The threshold detector 470 includes P-channel transistor 472, and N-channel transistor 474. Optionally, threshold detector 470 also includes N-channel transistor 476, and pull up pre-driver 420 includes a P-channel: transistor 478. In response to a logic low signal QB, transistor 478 becomes conductive and functions to accelerate the transition of signal PD_1 to a low voltage. In addition, the PMOS transistor 478 functions to provide hot carrier injection (HCI) protection to NMOS transistor 424.

In pre-driver circuit 420, P-channel transistor 422 has a first current electrode (source) coupled to a first power supply voltage terminal labeled "P-VDD", a control electrode (gate) for receiving an input signal labeled "Q", and a second current electrode (drain) connected to a first terminal of transition controller 425. Configurable resistance circuit 480 has a first terminal coupled to the drain of the first P-channel transistor, and a second terminal. N-channel transistor 424 has a drain coupled to the second terminal of configurable resistance circuit 480, a gate for receiving the signal corresponding to the input signal (Q), and a source coupled to a second power supply voltage terminal connected to a ground potential.

In threshold detector 470, P-channel transistor 472 has a source coupled to P-VDD, a gate coupled to the drain of N-channel transistor 424, and a drain for providing a control voltage to configurable resistance circuit 480. N-channel transistor 474 has a drain coupled to the drain of P-channel transistor 472, a gate for receiving a control signal labeled "QB", and a source coupled to ground. A stacked N-channel transistor 476 may optionally be coupled between P-channel transistor 472 and the N-channel transistor 474, for compensating for hot carrier injection. The optional P-channel transistor 478 has a source coupled to the second terminal of configurable resistance circuit 480, a gate for receiving signal QB, and a drain coupled to the ground. P-channel transistor 478 is provided for accelerating the voltage transition at the gate of P-channel transistor 472 and thereby accelerating the voltage transition at the first terminal of configurable resistance 480. In other words, transistor 478 speeds the process of pulling the gate of output transistor 450 to near its turn on threshold. Signal PD_1 will still lead signal PD_2, so threshold detector 470 has enough lead time to switch resistance values to control the transition, whether transistor 478 is present in the circuit or not.

In threshold detector 470, transistor 472 provides an output signal that is fed back to control configurable resistor 480. N-channel transistor 474 is operable to reset the drain of transistor 472 during a high to low transition of the OUT signal 495, and thus reset the output signal from transistor 472 that is fed back into the configurable resistor 480 to prepare configurable resistor 480 for the next transition. Transistor 476 is employed in a stacked configuration to minimize the deleterious effects of hot carrier injection (HCI) in certain embodiments of the invention. An output signal PD_2, provided by the second current electrode of transistor 422 in pull up pre-driver 420, is coupled to the gate of pull up driver transistor 450, and an OUT signal 495 is driven by the pull up driver transistor 450. The OUT signal 495 is also connected to the pull down driver 160 illustrated in the FIG. 1.

By way of example, when input signal IN1_B transitions from a high voltage to a low voltage, signal Q will become a level shifted logic high and signal QB will become a level shifted logic low. Transistor 424 will become conductive and transistor 422 will be substantially non-conductive. The control signal from threshold detector 470 will initially be low, causing the configurable resistor 480 to be at a lower first value. Signal PD_2 will be pulled down through the lower first value of configurable resistor 480. Signal QB will be low, causing transistor 474 to be substantially non-conductive, and as signal PD_1 decreases, P-channel transistor 472 will become conductive. The control signal therefore will be pulled high at a predetermined threshold to cause configurable resistor 480 to be at a second higher value, thus reducing the speed at which PD_2 becomes low. Note that the resistance of configurable resistor 480 ensures that when transistor 472 turns on and pulls down the gate of transistor 450, signal PD_1 will be at a lower voltage than signal PD_2. This permits the threshold detector 470 to act to change the value of configurable resistor 480 before signal PD_2 crosses the critical turn on threshold of driver transistor 450.

FIG. 5 illustrates, in schematic diagram form, a pull down pre-driver 530 in a circuit portion 500 in accordance with another embodiment of the present invention. Circuit portion 500 includes inverter 510, pull down pre-driver 530, transition controller 525, and driver transistor 560. Pull down pre-driver 530 includes pre-driver pull up P-channel transistor 524, a pre-driver pull down N-channel transistor 522, and the transition controller 525. The transition controller 525 includes a configurable resistor 580 and a threshold detector 570. An IN2_B signal 504 is provided to both the gates of pre-driver pull up transistor 524 and pre-driver pull down transistor 522. An output signal PD_2, provided by pre-driver pull down transistor 522, is coupled to a pull down driver transistor 560, and an OUT signal 595 is driven by the pull down driver transistor 560. The OUT signal 595 is also connected to the pull up driver 150 illustrated in the FIG. 1.

In operation, when signal IN2_B at input terminal 504 transitions to a low voltage, transistor 524 will initially be conductive and transistor 522 will initially be non-conductive. As the voltage of signal IN2_B is reduced, transistor 524 becomes substantially non-conductive and transistor 522 becomes conductive, signal PD_1 will fall, causing signal PD_2 to also fall with a voltage lag relative to signal PD_1. The voltage lag is due to the resistance of configurable resistor 580. When signal PD_1 begins transitioning to a low voltage, configurable resistor 580 is at a relatively low resistance value. As the voltage of signal PD_1 decreases to a predetermined threshold, threshold detector 570 will cause configurable resistor 580 to become a relatively high resistance value, thus slowing the transition of PD_2 in a manner similar to the circuit operation of FIG. 4.

FIG. 6A illustrates, in schematic diagram form, configurable resistor 680 in accordance with one embodiment of the present invention. Configurable resistor 680 is similar to configurable resistor 480 (FIG. 4) and includes a P-channel transistor 682 having an inherent series resistance and a transmission gate 684 also having an inherent series resistance. For example, P-channel 682 may be a long channel device. A control signal CONTROL is provided to the gate of P-channel transistor 682. When the control signal is in one state (e.g., low), the total resistance of the configurable resistor 680 is the parallel sum of the resistances of both the transistor 682 and the CMOS transmission gate 684. Alternatively, when the control signal is in another state (e.g., high), the total resistance of the configurable resistor 680 is the series value of only the CMOS transmission gate 684 whose resistance is necessarily greater than the parallel combination of the transistor 682 and the CMOS transmission gate 684. By turning transistor 682 on or off, two resistance values can be provided. The configurable resistor 680 illustrates one embodiment in which different resistances are switched into an application as needed at various times not actually using any "resistors" per se. Note that the transistor type in configurable resistor 680 depends on the circuit in which it is used. For example, if configurable resistor 680 is used in configurable resistor 580 of FIG. 5, transistor 682 would preferably be an N-channel transistor. If configurable resistor 680 is used in configurable resistor 480 of FIG. 4, transistor 682 would preferably be a P-channel transistor as shown in FIG. 6A.

FIG. 6B illustrates, in schematic diagram form a-configurable resistor 681 in accordance with another embodiment of the present invention. The configurable resistor 681 includes resistors 686 and 688. A switch 689 is included in series with resistor 686. When switch 689 is closed by the control signal CONTROL, the total resistance of the configurable resistor 681 is the parallel combination of a resistor 686 and a resistor 688. Alternatively, when the switch 689 is open, the total resistance of the configurable resistor 681 is only the series resistance of the resistor 688.

In view of the above detailed description of the present invention and associated drawings, other modifications and variations will now become apparent to those skilled in the art. It should also be apparent that such other modifications and variations may be effected without departing from the scope of the present invention.

What is claimed is:

1. An output buffer comprising:
 a first P-channel transistor having a first current electrode coupled to a first power supply voltage terminal, a control electrode for receiving a signal corresponding to the input signal, and a second current electrode for providing a predriver signal;
 a configurable resistance circuit having a first terminal coupled to the second current electrode of the first P-channel transistor, and a second terminal, the configurable resistance circuit switching in a first predetermined resistance during a beginning of a transition of the predriver signal and switching in a second predetermined resistance during an end of the transition of the predriver signal;
 a first N-channel transistor having a first current electrode coupled to the second terminal of the configurable resistance circuit, a control electrode for receiving the signal corresponding to the input signal, and a second current electrode coupled to a second power supply voltage terminal;

a drive transistor, coupled between a third power supply voltage terminal and an output terminal, the drive transistor having a gate for receiving the pre-driver signal, and in response, the drive transistor for transitioning an output signal at the output terminal; and a threshold detection circuit comprising:
  a second P-channel transistor having a first current electrode coupled to the first power supply voltage terminal, a control electrode coupled to the first current electrode of the first N-channel transistor, and a second current electrode for providing a control voltage to the configurable resistance circuit; and
  a second N-channel transistor having a first current electrode coupled to the second current electrode of the second P-channel transistor, a control electrode for receiving a control signal, and a second current electrode coupled to the second power supply voltage terminal;
  the threshold detection circuit causes the configurable resistance circuit to change from the first predetermined resistance to the second predetermined resistance in response to a voltage of the pre-driver signal crossing a predetermined threshold voltage.

2. The output buffer of claim 1 wherein the pre-driver signal having a first voltage level at an input of the configurable resistance circuit and a second voltage level at an output of the configurable resistance circuit, the second voltage level lagging the first voltage level when the pre-driver signal transitions, and wherein the threshold detection circuit selects the first predetermined resistance during the beginning of the transition of the pre-driver signal and switches in the second predetermined resistance at a predetermined time after the beginning of the transition of the pre-driver signal.

3. The output buffer of claim 1 further comprising a stacked N-channel transistor, coupled between the second P-channel transistor and the second N-channel transistor, for compensating for hot carrier injection.

4. The output buffer of claim 1, further comprising a third P-channel transistor having a first current electrode coupled to the second terminal of the configurable resistance circuit, a control terminal for receiving the control signal, and a second current electrode coupled to the second power supply voltage terminal, the third P-channel transistor for accelerating a voltage transition at the gate control of the drive transistor via the configurable resistance circuit.

5. The output buffer of claim 1, wherein the drive transistor is characterized as being a pull-up transistor.

6. The output buffer of claim 1, wherein the configurable resistance circuit comprises:
  at least two parallel connected transistors, coupled to the threshold detection circuit, for providing the first predetermined resistance and the second predetermined resistance based on the control voltage.

7. A buffer circuit, comprising:
a pre-driver circuit comprising;
  a first transistor having a first current electrode coupled to a first power supply voltage terminal, a control electrode for receiving a signal corresponding to an input signal, and a second current electrode;
  a transition controller circuit having a first terminal coupled to the second current electrode of the first transistor, and a second terminal, the transition controller circuit providing a first resistance value at the beginning of a voltage transition detected in the pre-driver circuit, and for providing a second resistance value when the voltage transition reaches a predetermined threshold, wherein the voltage transition is detected by a threshold detector for selecting one of the first or second resistance values by detecting a voltage of a logical complement of the signal corresponding to the input signal; and
  a second transistor having a first current electrode coupled to the second terminal of the transition controller circuit, a control electrode for receiving the signal corresponding to the input signal, and a second current electrode coupled to a second power supply voltage terminal; and an output driver transistor having a first current electrode coupled to a third power supply voltage terminal, a control electrode coupled to the predriver circuit, and a second current electrode for providing an output signal.

8. The buffer of claim 7, wherein the transition controller further comprises at least two parallel connected transistors for providing the first and second resistance values.

9. The buffer of claim 7, wherein the transition controller further comprises a series connected switch and first resistor combination connected in parallel with a second resistor for providing the first resistance value when the switch is closed and the second resistor provides the second resistance value when the switch is open.

10. The buffer of claim 7, wherein the threshold detector comprises:
  a pair of series-connected transistors, a first transistor of the series-connected transistors having a control terminal coupled to the second terminal of the transition controller circuit, a current electrode of the first transistor of the series-connected transistors for providing a control signal for selecting one of the first or second resistance values, a control terminal of the second transistor of the series-connected transistors coupled to receive the logical complement corresponding to the input signal.

11. The buffer circuit of claim 10, further comprising a third transistor coupled between the first and second transistors of the series-connected transistors for compensating for hot carrier injection.

12. The buffer circuit of claim 10, further comprising a third transistor having a current electrode coupled to the control terminal of the first transistor of the series-connected transistors, a control electrode for receiving the logical complement corresponding to the input signal, the third transistor for accelerating a voltage change at the control electrode of the output driver transistor in response to a voltage transition of the input signal.

13. The buffer circuit of claim 7, wherein the output driver transistor is characterized as being a pull-up transistor.

14. The buffer circuit of claim 7, further comprising a level shifter for receiving a single-ended input signal, and for providing true and complement level shifted input signals, wherein the true level shifted input signal being the signal corresponding to the input signal and the complement level shifted input signal being the logical complement of the input signal.

15. The buffer circuit of claim 7, wherein the buffer circuit is characterized as being an output buffer circuit.

* * * * *